US010461695B2

(12) United States Patent
Liu et al.

(10) Patent No.: US 10,461,695 B2
(45) Date of Patent: Oct. 29, 2019

(54) PLANAR DIFFERENTIAL INDUCTOR WITH FIXED DIFFERENTIAL AND COMMON MODE INDUCTANCE

(71) Applicant: QUALCOMM Incorporated, San Diego, CA (US)

(72) Inventors: Gang Liu, San Diego, CA (US); Jeremy Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 15/703,756

(22) Filed: Sep. 13, 2017

(65) Prior Publication Data
US 2018/0351528 A1 Dec. 6, 2018

Related U.S. Application Data

(60) Provisional application No. 62/513,385, filed on May 31, 2017.

(51) Int. Cl.
*H03B 5/12* (2006.01)
*H01F 17/00* (2006.01)
(Continued)

(52) U.S. Cl.
CPC ....... *H03B 5/1212* (2013.01); *H01F 17/0006* (2013.01); *H03B 5/1203* (2013.01);
(Continued)

(58) Field of Classification Search
CPC .......... H03B 5/08; H03B 5/12; H03B 5/1206; H03B 5/1209; H03B 5/1212;
(Continued)

(56) References Cited

U.S. PATENT DOCUMENTS

| 4,453,269 A | 6/1984 | Skar |
| 7,295,096 B2 * | 11/2007 | Tamata ............... H01F 17/0013 336/200 |

(Continued)

FOREIGN PATENT DOCUMENTS

CN 105244345 A 1/2016

OTHER PUBLICATIONS

International Search Report and Written Opinion—PCT/US2018/031174—ISA/EPO—dated Aug. 7, 2018.
(Continued)

*Primary Examiner* — Ryan Johnson
(74) *Attorney, Agent, or Firm* — Qualcomm Incorporated/Seyfarth Shaw LLP

(57) ABSTRACT

A planar differential inductor reduces an effect of parasitics on common mode inductance of a voltage controlled oscillator (VCO)-based inductor to properly ground a common mode alternating current (AC) ground. In one instance, the planar differential inductor includes a ground plane, routing lines, distributed capacitors, an exterior inductor structure, and an interior inductor structure. The planar differential inductor may be coupled to a capacitor as part of an LC tank that operates as a resonator within a VCO. The bypass capacitor array is coupled between the ground plane and the routing lines. The exterior inductor structure is coupled between the routing lines and a power supply. The interior inductor is within the ground plane and coupled between the routing lines and differential ports.

20 Claims, 13 Drawing Sheets

(51) Int. Cl.
*H03H 3/00* (2006.01)
*H03H 7/01* (2006.01)

(52) U.S. Cl.
CPC ......... *H03B 5/1228* (2013.01); *H03B 5/1234* (2013.01); *H03B 5/1243* (2013.01); *H03H 3/00* (2013.01); *H03H 7/0115* (2013.01); *H01F 2017/0073* (2013.01); *H01F 2017/0086* (2013.01); *H03B 2200/009* (2013.01)

(58) Field of Classification Search
CPC ............... H03B 5/1215; H03B 5/1228; H03B 2202/017; H01F 5/003; H01F 17/0006; H01F 17/0013; H01F 2017/004; H01F 2017/0073; H01F 2017/008; H01F 27/2804; H01F 27/2809
See application file for complete search history.

(56) References Cited

U.S. PATENT DOCUMENTS

| | | | |
|---|---|---|---|
| 7,546,097 B2 | 6/2009 | Dunworth et al. | |
| 7,911,027 B2 | 3/2011 | Itoh et al. | |
| 8,633,777 B2* | 1/2014 | Jin | H01L 23/645 331/117 FE |
| 9,337,138 B1 | 5/2016 | Abugharbieh et al. | |
| 9,478,344 B2* | 10/2016 | Liu | H01F 21/12 |
| 9,813,023 B2* | 11/2017 | Caffee | H03B 5/08 |
| 2013/0328642 A1 | 12/2013 | Ma et al. | |
| 2015/0295535 A1 | 10/2015 | Shi et al. | |
| 2015/0349711 A1 | 12/2015 | Han et al. | |
| 2016/0072456 A1 | 3/2016 | Lin et al. | |

OTHER PUBLICATIONS

Cho J-K., et al., "An On-Chip Differential Inductor and Its Use to RF VCO for 2 GHz Applications", Journal of Semiconductor Technology and Science, vol. 4, No. 2, Jun. 2004, pp. 83-87.

Shahmohammadi M., et al., "Tuning Range Extension of a Transformer-Based Oscillator Through Common-Mode Colpitts Resonance", IEEE Transactions on Circuits and Systems—I: Regular Papers, vol. 64, No. 4, Apr. 2017, pp. 836-846.

Murphy D., et al., "25.3 A VCO with Implicit Common-Mode Resonance", International Solid-State Circuits Conference (ISSCC), IEEE, 2015, 3 Pages.

* cited by examiner

PLANAR DIFFERENTIAL INDUCTOR WITH FIXED DIFFERENTIAL AND COMMON MODE INDUCTANCE

CROSS-REFERENCE TO RELATED APPLICATION

The present application claims the benefit of U.S. Provisional Patent Application No. 62/513,385, filed on May 31, 2017, and titled "PLANAR DIFFERENTIAL INDUCTOR WITH FIXED DIFFERENTIAL AND COMMON MODE INDUCTANCE," the disclosure of which is expressly incorporated by reference herein in its entirety.

TECHNICAL FIELD

The present disclosure generally relates to inductors used in integrated circuits such as voltage controlled oscillators. More specifically, the present disclosure relates to planar differential inductors with fixed differential and common mode inductance.

BACKGROUND

Mobile radio frequency (RF) chip designs (e.g., mobile RF transceivers) have migrated to a deep sub-micron process node due to cost and power consumption considerations. The design complexity of mobile RF transceivers is further complicated by added circuit function to support communication enhancements. Further design challenges for mobile RF transceivers include analog/RF performance considerations, including mismatch, noise, and other performance considerations. The design of these mobile RF transceivers includes the use of a differential inductor, for example, in combination with capacitors to provide the resonant tank for a voltage controlled oscillator.

In order to achieve good phase noise performance (e.g., 1/f noise performance) in a voltage controlled oscillator (VCO), a differential and common mode inductance of an inductor (e.g., a differential inductor) should be precisely controlled. While the differential inductance of the inductor is generally well controlled because of a virtual ground, a common mode inductance of the inductor can be significantly affected by external parasitics from routing, packaging, etc., if a low impedance common mode alternating current (AC) ground is not properly provided.

SUMMARY

A planar differential inductor may include a ground plane and multiple routing lines. The planar differential inductor also includes a bypass capacitor array coupled between the ground plane and the routing lines. The planar differential inductor also includes an exterior inductor structure and an interior inductor structure. The exterior inductor structure is coupled between the routing lines and a power supply. The interior inductor is within the ground plane and coupled between the routing lines and differential ports.

A method of fabricating a planar differential inductor may include fabricating a ground plane and fabricating multiple routing lines. The method also includes fabricating a bypass capacitor array coupled between the ground plane and the multiple routing lines. The method further includes fabricating an exterior inductor structure coupled between the routing lines and a power supply. Furthermore, the method includes fabricating an interior inductor structure within the ground plane. The interior inductor is coupled between the routing lines and differential ports.

A planar differential inductor may include a ground plane and multiple routing lines. The planar differential inductor also includes a bypass capacitor array coupled between the ground plane and the plurality of routing lines. The planar differential inductor also includes first means for achieving resonance with the bypass capacitor array and second means for achieving resonance with the bypass capacitor array. The first means is coupled between the routing lines and a power supply. The second means is within the ground plane and coupled between the routing lines and differential ports.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
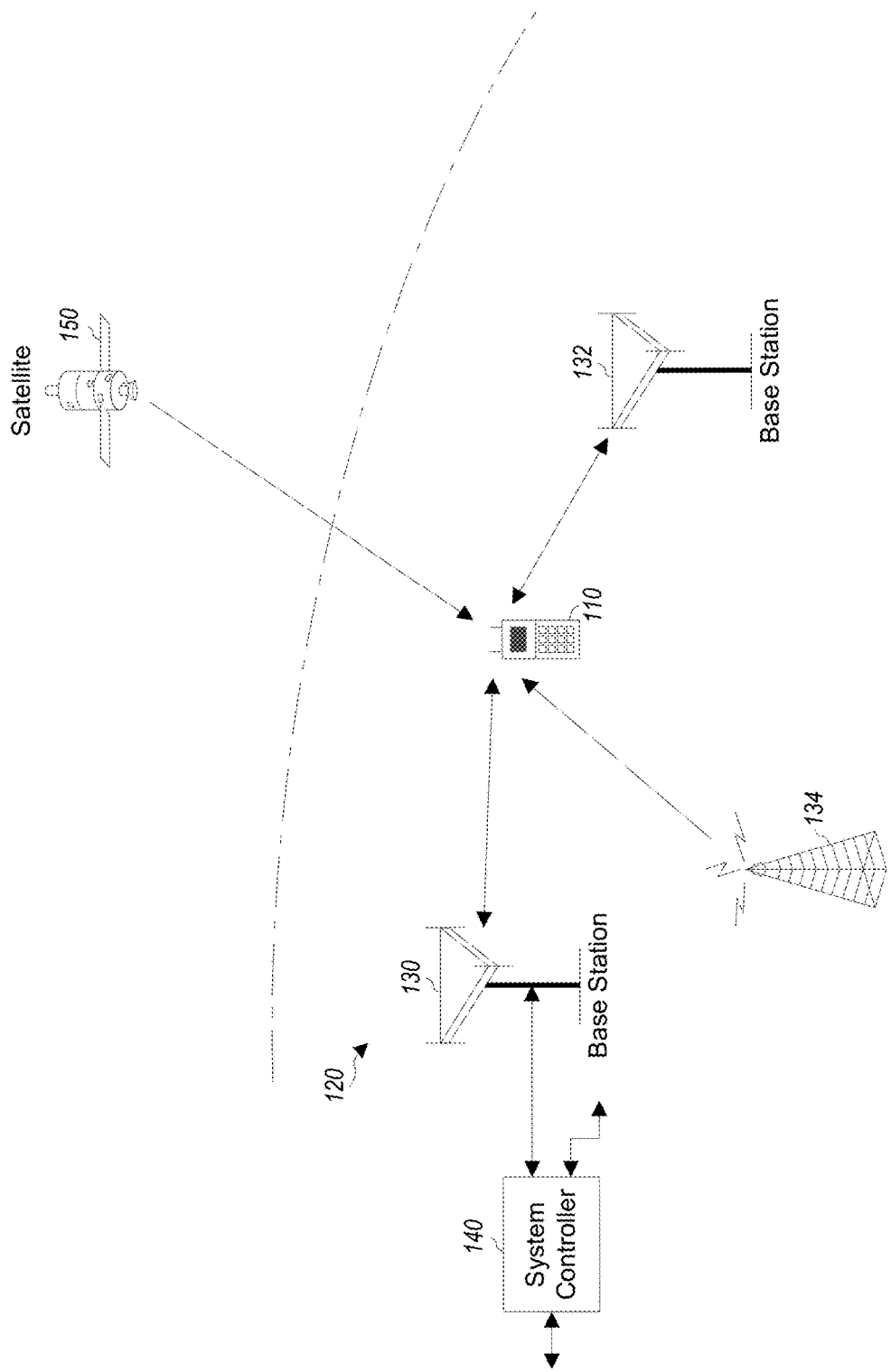
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. Further design challenges for mobile RF transceivers include analog/RF performance considerations, including mismatch, noise, and other performance considerations. The design of these mobile RF transceivers includes the use of a differential inductor, for example, in combination with capacitors to provide the resonant tank for a voltage controlled oscillator (VCO).

Improvement in phase noise of a VCO helps achieve success (e.g., improved data throughput) in future millimeter wave 5G systems or LTE systems. The VCO phase noise is a significant contributor to the integrated phase noise (IPN) of the local oscillator signal at millimeter wave frequencies. Further the IPN is a significant contributor to the error vector magnitude (EVM) of the transmitted and received data and thus can impact data throughput.

In order to achieve good phase noise performance (e.g., 1/f noise performance) in a voltage controlled oscillator (VCO), the differential and common mode inductance of an inductor should be precisely controlled. While the differential inductance of the inductor is generally well controlled because of a virtual ground, a common mode inductance of the inductor can be significantly affected by external parasitics from routing, packaging, etc., if a common mode alternating current (AC) ground (e.g., Vdd) is not properly grounded.

Some VCOs improve phase noise by implementing a two-turn inductor with a connection point in the center of the inductor, which is also referred to as a center-tapped inductor. The center-tapped inductor may include differential output ports associated with voltages Vp and Vn from an inductor-capacitor (LC) tank and a supply voltage port to receive a supply voltage Vdd. However, the common mode inductance of this inductor can be significantly affected by external parasitics. For example, any power supply routing or parasitic capacitance connected between the power supply providing the supply voltage and the inductor center tap influences the common mode inductance by changing the length, and thus inductance of a common mode connection at the inductor center tap. Some inductors use dual supply ports to ease the routing of the supply voltage, but the common mode inductance can still be affected by the external parasitics on the Vdd line.

Aspects of the present disclosure include a planar differential inductor that reduces the effect of parasitics on the common mode inductance of the VCO-based inductor to properly ground the common mode AC ground (e.g., Vdd). The proper grounding or strong on-chip grounding of the common mode AC ground node of the planar differential inductor keeps the common mode inductance from being affected by the on-chip supply routing or external parasitics. Thus, aspects of the disclosure achieve a strong AC ground on a chip to isolate the planar differential inductor from hard to control routing and packaging parasitics. In one aspect, the planar differential inductor includes a ground plane, routing lines, distributed capacitors (e.g., a bypass capacitor array), an exterior inductor structure, and an interior inductor structure. The planar differential inductor may be coupled to a capacitor as part of an LC tank that operates as a resonator within a VCO.

The bypass capacitor array is coupled between the ground plane and the routing lines. The routing lines are different from shielding. The routing lines are connected to the DC supply, which is different from shielding that is connected to the ground. Additionally, while shields can be above or below the inductor, the routing lines for the DC supply are adjacent to the inductor but not above or below, and can be in the same metal layer as the inductor or another thick metal layer, but do not overlap the inner or outer inductor structures. The bypass capacitor array includes a first bypass capacitor array and a second bypass capacitor array. The first bypass capacitor array is coupled to a first routing line, and the second bypass capacitor array is coupled to a second routing line. In one aspect, the first bypass capacitor array does not directly couple to the second bypass capacitor array. Similarly, the first routing line is separate from the second routing line.

The exterior inductor structure is coupled between the routing lines and a power supply. The interior inductor structure is within the ground plane and coupled between the routing lines and differential ports. The interior inductor structure may be a two-turn inductor. In one aspect of the disclosure, the exterior inductor structure partially encloses the interior inductor structure. In some aspects, the exterior inductor structure partially encloses a capacitor bank of the VCO, a low dropout (LDO) to provide power supply to the VCO, and/or VCO core transistors. In one aspect, the exterior inductor structure may include two inductors coupled to the ground plane via the distributed capacitors. The interior inductor can be large or small, depending on the application.

In general, the exterior inductors can be sufficiently large enough that the resonance frequency of the exterior inductor and the bypass capacitors is below the operating frequency of the interior inductor or VCO. Thus, the capacitors are coupled through a choke instead of through the Vdd port, such that the planar differential inductor is tapped at a center. By including the exterior inductor structure, inductances from external routings of a Vdd port for receiving power from the power supply can be isolated. The exterior inductor structure may be a routing inductor. The routing inductor and the bypass capacitor array form a resonance at a frequency that is much lower than the operating frequency of the VCO. Therefore, at an operating frequency of the VCO, both the differential mode inductance and the common mode inductance of the interior inductor structure are not affected by any further inductances from the Vdd port.

In one aspect of the disclosure, the routing lines are positioned outside of the ground plane. For example, the routing lines are outside of a perimeter of the ground plane. In yet another aspect, the routing lines are on a different layer than a layer of the ground plane. For example, the routing lines may be over the ground plane.

Figure 12:
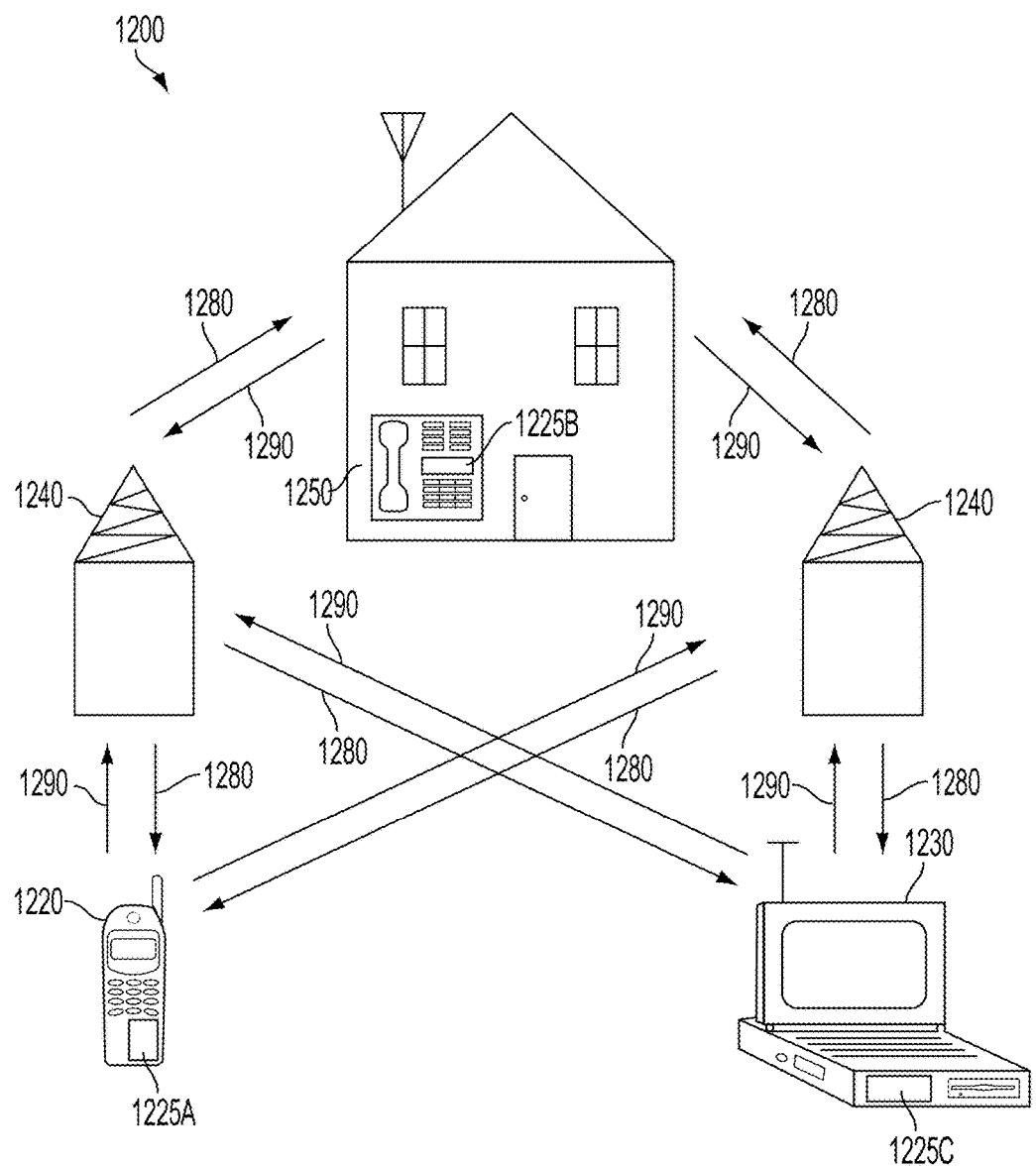
FIG. 12 is a block diagram showing an exemplary wireless communication system in which a configuration of the disclosure may be advantageously employed.

The aspects of the present disclosure may be implemented in the system of FIGS. 1 and 12. More specifically, aspects of the present disclosure may be implemented in the wireless device of FIG. 2 (e.g., transmit phase locked loop (TX PLL) 292 and/or receive (RX) PLL 282) and/or in the VCO of FIGS. 3, 4, and 9.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
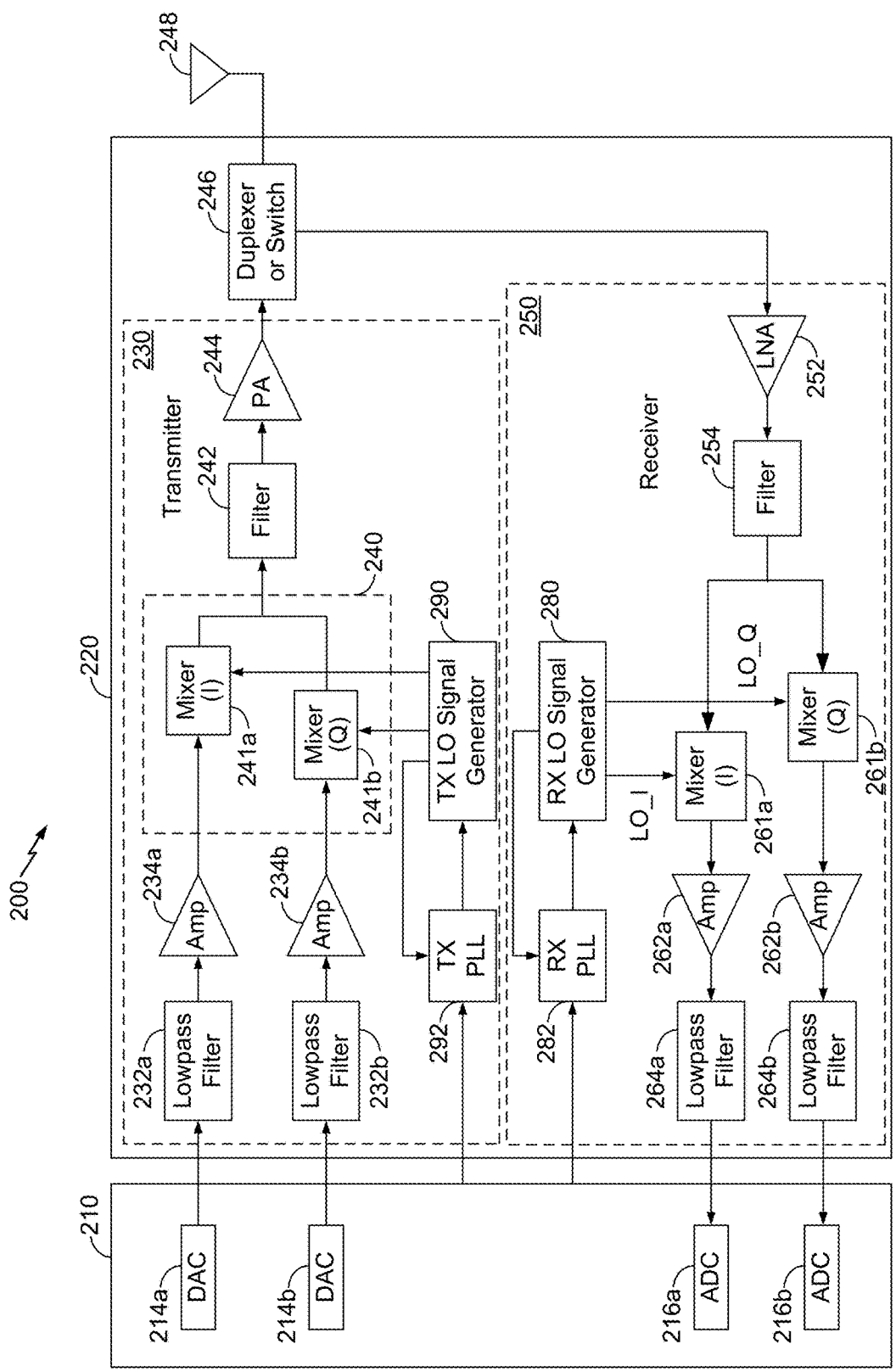
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
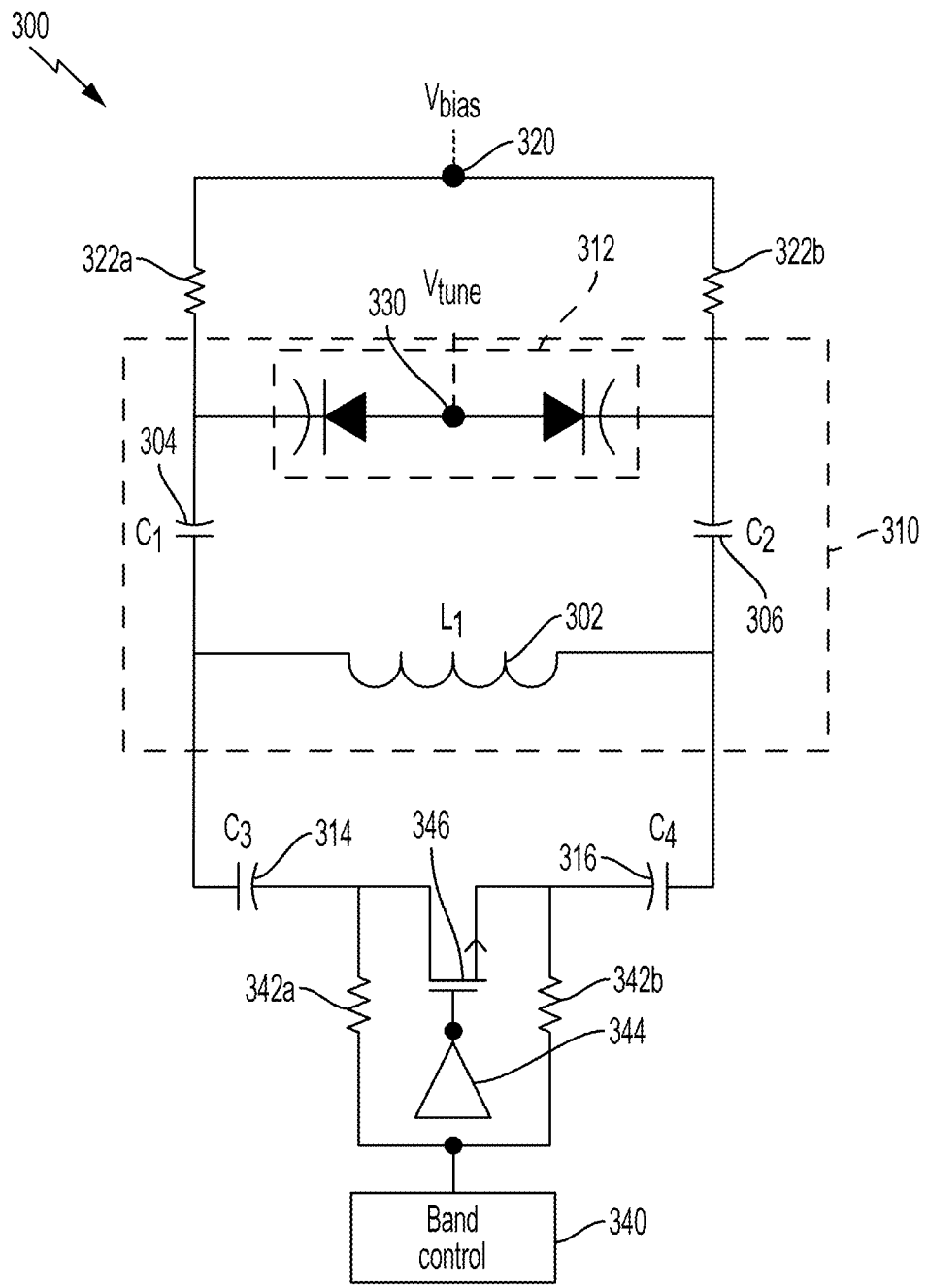
FIG. 3 shows an exemplary circuit diagram of a resonant tank in an oscillator circuit.

FIG. 3 is a generalized circuit diagram of a resonant tank of an oscillator circuit. Some components may be missing to facilitate explanation. An oscillator circuit resonant tank (oscillator) 300 is shown. The oscillator 300 may have an inductor L$_1$ 302 electrically coupled to a pair of coupling capacitors C1 304 and C2 306. In some aspects, the coupling capacitors C1 304 and C2 306 electrically couple the inductor L1 302 to a varactor circuit, shown as a pair of varactors 312. The varactors 312 may operate as voltage controlled capacitors. The inductor L1 302 may further be electrically coupled to a pair of coarse tuning capacitors: a coarse tuning capacitor C3 314 and a coarse tuning capacitor C4 316 (referred to as "coarse capacitors"). The combination of L1 302, C1 304, C2 306, and the varactors 312 may also be referred to as a "tank circuit," "tank" or "LC circuit" 310 (indicated in dashed lines). In some aspects, the tank 310 can act as an electrical resonator, storing energy oscillating at a characteristic resonant frequency of the circuit.

In some aspects, the tank 310 may not have all of the components identified in FIG. 3 and described, depending on the configuration of the oscillator 300. The tank 310 may have only a single capacitor and a single inductor. In some aspects, the tank 310 can include L1 302 in combination with C1 304, C2 106, C3 314 and C4 316. In another aspect, the tank 310 can be considered to include L1 302 in combination with C1 304, C2 306, C3 314, C4 316, and the varactors 312. In yet another aspect, the tank 310 may have additional inductive, capacitive, and resistive circuitry implemented to change or regulate the resonant frequency of the tank 310.

The oscillator 300 can further have an input voltage bias (Vbias) 320. An input may generally refer to an electrical coupling that can receive a voltage input, for example. The Vbias 320 may be or receive a variable or constant direct current (DC) voltage applied to C1 304 and C2 306 of the tank 310. The oscillator 300 may further have an input voltage (Vtune) 330. The Vtune 330 may also be or receive a variable or constant DC voltage applied to the varactors 312 to tune or adjust the frequency of the oscillator 300. The capacitance of the varactors 312 can further be a function of the difference between the Vbias 320 and the Vtune 330. Additionally, as the capacitance of the varactors 312 is changed, the frequency of the oscillator 300 also changes.

In an aspect, the input Vbias 320 and the input Vtune 330 in combination with the tank 310 and the varactors 312 can be combined as the oscillator 300 configured as a VCO.

In some aspects, the oscillator 300 may further comprise a band control input 340 ("band control 340") electrically coupled to the coarse capacitors 314 and 316. The coarse capacitors C3 314 and C4 316 may form a portion of a switchable capacitor array for use in the oscillator 300 (e.g., a VCO or a digitally controlled oscillator (DCO)). The coarse capacitors C3 314 and C4 316, in conjunction with a metal oxide semiconductor (MOS) device 346 (referred to as "switch 346") and an inverter 144 can comprise such a switchable array. The switch 346 can be an n-type MOS (NMOS) or a p-type MOS (PMOS) transistor, having a drain coupled to the coarse capacitor C3 114, a source coupled to the other coarse capacitors C4 316, and a gate coupled to a control signal, shown as the band control 340. The band control 340 can be coupled to the switch 346 via an inverter 344. In some aspects, the inverter 344 may not be present.

The band control 340 can provide a digital control signal for a DCO to generate a clock signal, for example. Thus, the bottom portion of the oscillator 300 of FIG. 3, taken by itself, may comprise a DCO. The band control 340 may supply the digital signal to the inverter 344 and the switch 346 to induce a voltage to the tank 310. The inverter 344 and the switch 346 may not be specified for certain VCO implementations.

In some aspects, a number of resistors may be included in the oscillator 300 to minimize or reduce the phase noise contributed by the varactors 312. For example, resistors 322a, 322b (collectively resistors 322) may be incorporated in the oscillator 300 in shunt between the Vbias 320 and the tank 310. The value of the resistors 322 can be selected to be high enough to reduce the noise contribution of the varactors 312 but low enough so as to not increase the thermal noise contribution of the tank circuit (that would negatively affect the Q-factor of the tank 310). Accordingly, the resistor value may be in the kilo ohm (kΩ) range (e.g., 1K ohm-1000 K ohm). However, in such an aspect, the resistors 322 themselves can contribute varying levels of thermal noise, resulting in phase noise and jitter induced in the output of the oscillator 300.

In a similar fashion, resistors 342a, 342b (collectively resistors 342) may also be incorporated in the oscillator 300 to bias the switch 346. Using the threshold voltage ($V_{th}$) of the switch 346, the value of the resistors 342 can be selected to turn the switch 346 on and off based on the signal supplied by the band control 340. The switch 346 can thus be used to reliably switch the coarse capacitors $C_3$ 314 and $C_4$ 316 on or off from (or in and out of) the LC tank 310 so that the oscillator 300 can precisely generate a specified high frequency signal according to the band control 340 signal. In some aspects, the band control 340 is a digital signal that alternatively switches the coarse capacitors $C_3$ 314 and $C_4$ 316 in and out of the oscillator 300 circuit to create the output signal (e.g., a clock signal).

In some aspects, the thermal noise added by the resistors 322, 342 may be a result of thermal flux inside the individual resistors 322 and 342. The thermal flux may add a noise component to the VCO frequency and ultimately manifest as phase noise (in a VCO, for example) or jitter (in a DCO, for example). The phase noise/jitter degrades the spectral purity of the oscillator 300 and may negatively affect the Q-factor.

Figure 4:
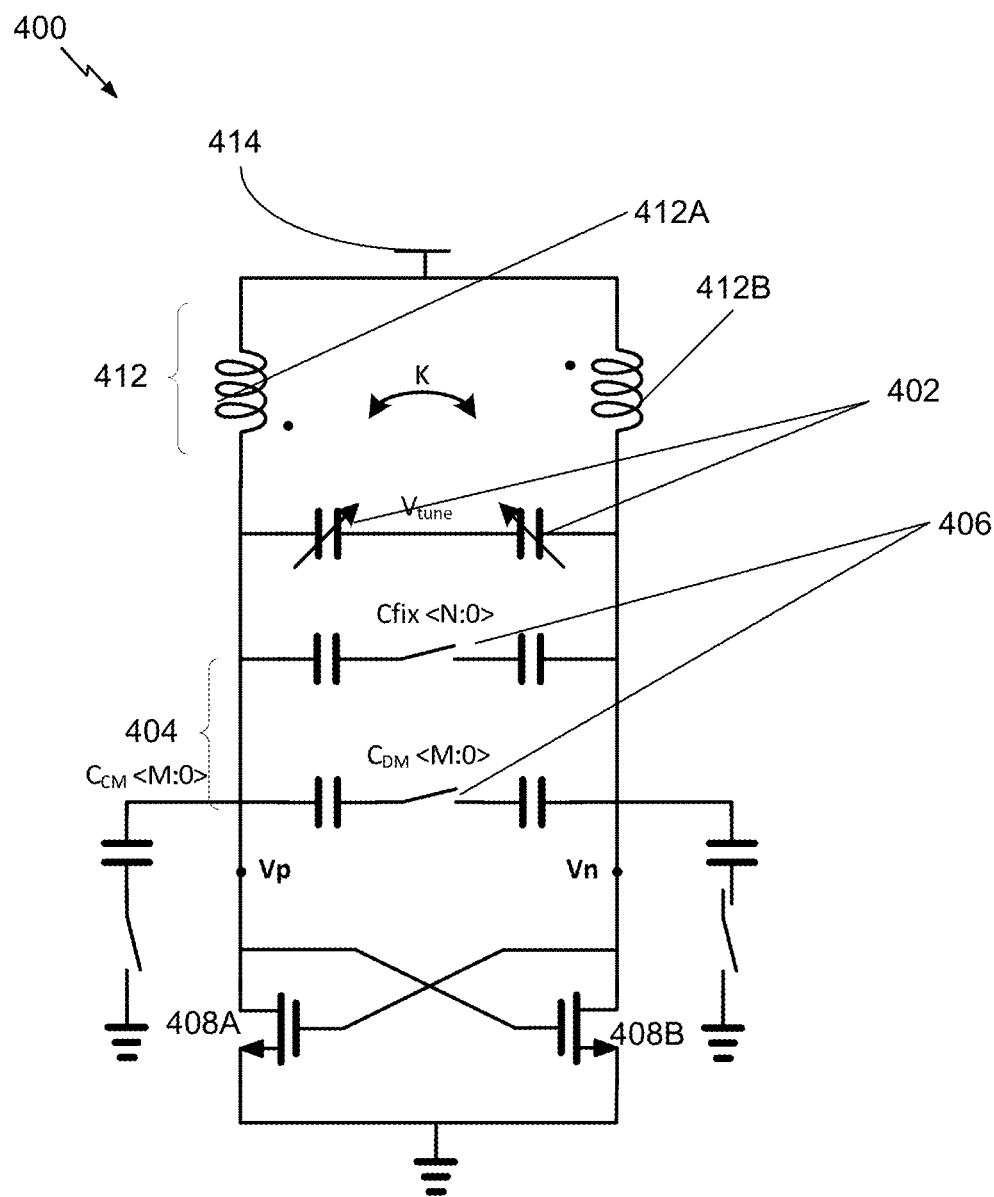
FIG. 4 illustrates an exemplary core of a voltage controlled oscillator (VCO) according to aspects of the present disclosure.

FIG. 4 illustrates an exemplary core 400 of a voltage controlled oscillator (VCO) according to aspects of the present disclosure. The VCO core 400 includes an inductor-capacitor (LC) tank (e.g., VCO capacitor tuning circuit) that includes a digitally controlled differential metal-metal capacitor $C_{DM}$, digitally controlled single ended metal-metal capacitor $C_{CM}$, and a fixed adjustment capacitor Cfix, which can be digitally controlled or not. The inductor-capacitor tank may also include an analog controlled varactor 402, represented by the capacitor symbol with an arrow through the capacitor and controlled by voltage vtune. The VCO core 400 further includes inductor 412 (e.g., differential inductors 412A and 412B). These differential inductors 412A and 412B may be arranged in accordance with a two-turn inductor implementation. A supply voltage Vdd is provided to a center tap contact 414 of the inductor 412 of the VCO core 400.

The output frequency of the VCO changes when a voltage applied to the inductor-capacitor tank is varied. For example, the tuning voltage vtune may be applied to variable capacitance elements (e.g., the varactor 402) in the inductor-capacitor tank. The tuning voltage vtune may be applied to the varactor 402 to achieve fine adjustment of frequency. Selection of capacitors $C_{DM}$ or Cfix in a capacitor bank 404 is controlled by on/off control of switches 406 between the capacitors $C_{DM}$ and/or Cfix to vary the capacitance of the VCO. In some aspects, the varactor 402 and/or the capacitor $C_{CM}$ may be part of or collectively referred to as the capacitor bank 404 of the VCO. A cross coupled pair of transistors 408A and 408B are part of transistors of the VCO core 400. Vp and Vn are differential outputs from the inductor-capacitor tank.

Figure 5:
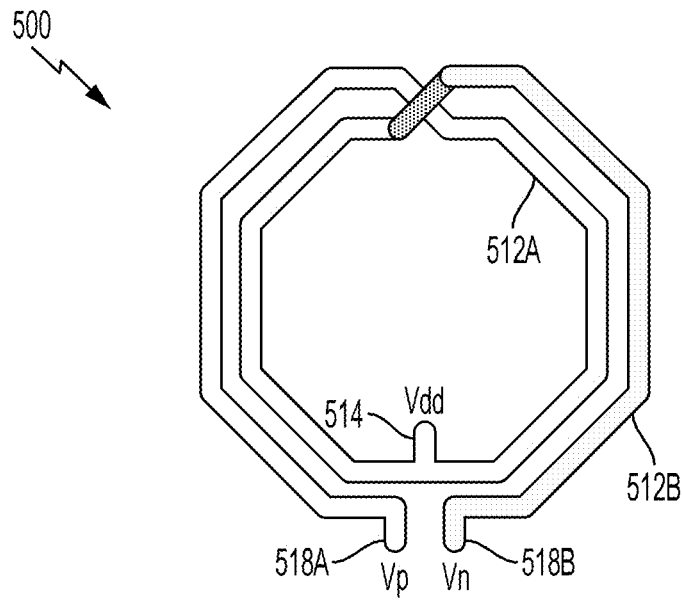
FIG. 5 illustrates an exemplary center-tapped two-turn inductor.

FIG. 5 illustrates an exemplary center-tapped two-turn inductor 500. The two-turn inductor 500 is center-tapped and therefore deemed a center-tapped two-turn inductor 500. The center-tapped two-turn inductor 500 includes an inner turn 512A and an outer turn 512B. The inductor 500 may be similar to the inductor 412 such that Vp and Vn are differential outputs from the LC tank. The differential outputs Vp and Vn are connected to the outer turn 512B. For example, differential outputs Vp and Vn are respectively provided to a first differential node 518A and a second differential node 518B of the outer turn 512B of the center-tapped two-turn inductor 500. A supply voltage Vdd is provided to a center tap node 514, which is a contact at a point halfway along a winding of the center-tapped two-turn inductor 500. The inner turn 512A is used to receive the supply voltage Vdd, at the center tap node 514. Any parasitics connected to the center tap node 514 (or Vdd) influence the common mode inductance. For example, Vdd is subject to parasitic inductance because Vdd is routed from a center of the inductor to a bump pad or bond pad outside the VCO inductor.

Figure 6:
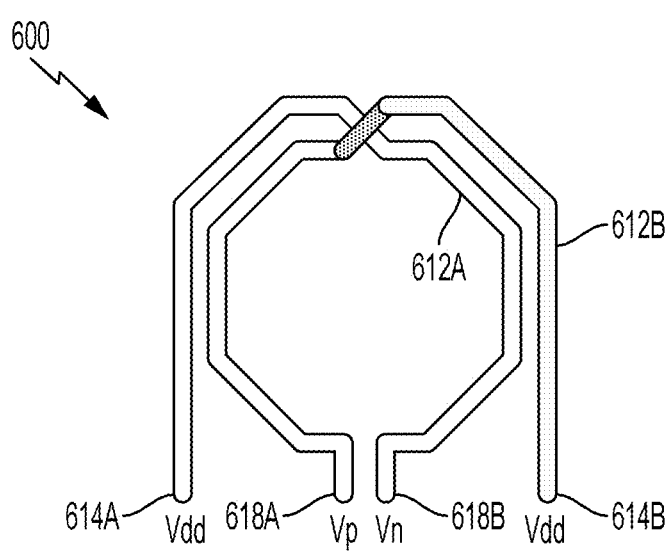
FIG. 6 illustrates an exemplary two-turn inductor with dual supply ports.

FIG. 6 illustrates an exemplary two-turn inductor 600 with dual supply ports or nodes. The two-turn inductor 600 includes an inner turn 612A and an outer turn 612B. For example, the two-turn inductor 600 of FIG. 6 is similar to the center-tapped two-turn inductor 500 of FIG. 5, except that the two-turn inductor 600 includes a first supply node 614A and a second supply node 614B. Moreover, the differential outputs Vp and Vn from the LC tank are connected to the inner turn 612A, instead of the outer turn 512B, as in FIG. 5. For example, the differential outputs Vp and Vn are respectively provided to a third differential node 618A and a fourth differential node 618B of the inner turn 612A of the two-turn inductor 600. The outer turn 612B is used to receive the supply voltage Vdd, at the first supply node 614A and the second supply node 614B.

Figure 7A:
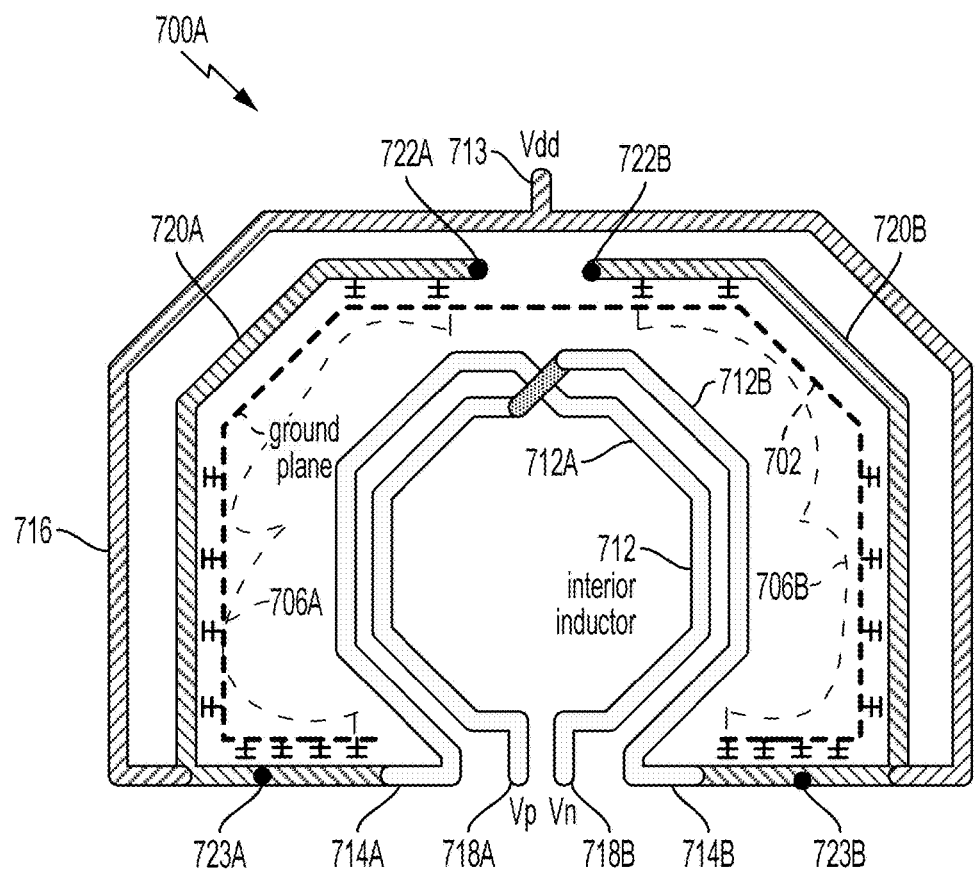
FIG. 7A illustrates a structure of a planar differential inductor with fixed differential and common mode inductance according to aspects of the present disclosure.

FIG. 7A illustrates an exemplary structure of a planar differential inductor 700A with fixed differential and common mode inductance, according to aspects of the present disclosure. The planar differential inductor 700A includes a ground plane 702, routing lines 720 (e.g., a first routing line 720A and a second routing line 720B), a bypass capacitor array including a first set of bypass capacitors 706A and a second set of bypass capacitors 706B, an exterior inductor 716 (or a first inductor portion of the planar differential inductor 700A), and an interior inductor 712 (or a second inductor portion of the planar differential inductor 700A). The interior inductor 712 includes an inner turn 712A and an outer turn 712B. The interior inductor 712 is partially enclosed by the exterior inductor 716.

In one aspect, the routing lines (e.g., first routing line 720A and the second routing line 720B) are on a different level or layer relative to the ground plane 702. The first routing line 720A and the second routing line 720B are outside a perimeter of the ground plane 702. The differential outputs Vp and Vn are connected to the inner turn 712A. For example, the differential outputs Vp and Vn are respectively provided to a fifth differential node 718A and a sixth differential node 718B of the inner turn 712A of the interior inductor 712. A supply voltage Vdd is provided to a center tap node 713, which is a contact at a point halfway along a winding of the exterior inductor 716.

The first set of bypass capacitors 706A and the second set of bypass capacitors 706B are coupled between the ground plane 702 and the routing lines 720. The exterior inductor 716 (or at least a portion of the exterior inductor 716) is coupled between the routing lines 720 and the center tap node 713. The interior inductor 712 is within the ground plane 702 and is coupled between the routing lines 720 and the fifth and sixth differential nodes 718A and 718B. For example, a first coupling node 714A and a second coupling node 714B of the outer turn 712B are respectively coupled to the first routing line 720A and the second routing line 720B. The first routing line 720A is coupled to the first set of capacitors 706A and the second routing line 720B is coupled to the second set of capacitors 706B. The first routing line 720A and the second routing line 720B may be coupled to terminals along their paths such that a low impedance exists between one or more of the terminals at low frequency (e.g., DC). In some aspects, the non-negligible impedance may exist between one or more of the terminals at some radio frequencies. For example, the impedance may exist between terminal 722A and terminal 723A or between terminal 722B and 723B.

In one aspect of the disclosure, one end (e.g., terminal 722A) of the first routing line 720A that is connected to the first set of bypass capacitors 706A is disconnected from another end (e.g., terminal 722B) of the second routing line 720B that is connected to the second set of bypass capacitors 706B. When the routing lines 720A and 720B of the bypass capacitors 706A and 706B are not connected to each other the bypass capacitors behave as capacitors for both common mode and differential mode excitation. The added inductor (e.g., exterior inductor 716) can shift the resonance frequency of the bypass capacitors and exterior inductor to a much lower frequency (e.g. around 7 GHz), so that the differential inductance of the planar differential inductor 700A is almost constant across the operating frequency range of the inductor. Otherwise, when the first set of bypass capacitors 706A are connected to the second set of bypass capacitors 706B (e.g., through the connection of first routing line 720A and second routing line 720B), a resonance is formed between the routing lines (e.g., Vdd routing) and the bypass capacitor arrays, which adds more fluctuation to the inductance (e.g., variation vs. frequency to the differential inductance.)

The planar differential inductor 700A achieves strong on-chip grounding of a common mode alternating current (AC) ground node that keeps a common mode inductance from being affected by external parasitics.

Aspects of the present disclosure improve phase noise of the VCO. The aspects achieve success in future millimeter-wave 5G systems, as the VCO phase noise is a significant contributor to the integrated phase noise (IPN) of the LO signal at millimeter-wave frequencies.

Figure 7B:
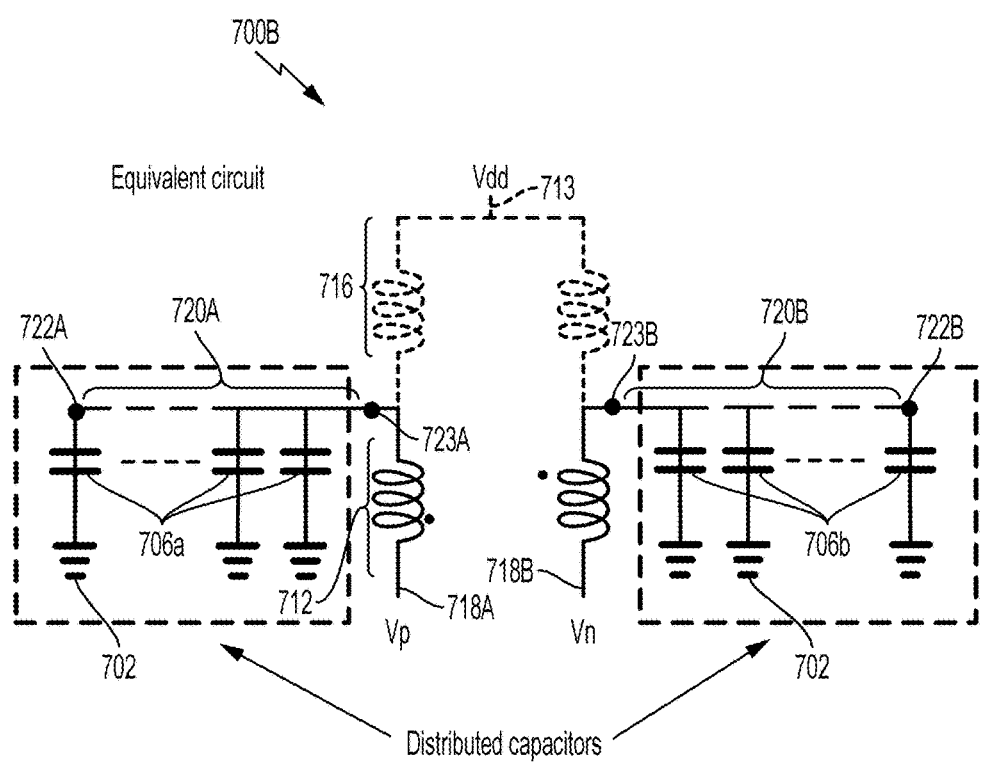
FIG. 7B illustrates an equivalent circuit of the structure of the planar differential inductor of FIG. 7A according to aspects of the present disclosure.

FIG. 7B illustrates an equivalent circuit 700B of the structure of the planar differential inductor 700A of FIG. 7A. For illustrative purposes, the labelling and numbering of the devices and features of FIG. 7B are similar to those of FIG. 7A. For example, the interior inductor 712 (e.g., a two-turn interior inductor), includes differential tank ports (e.g., the fifth and sixth differential nodes 718A and 718B) connected to the inner turn 712A. The ground plane 702 is distributed around the interior inductor 712. The equivalent circuit 700B includes the first routing line 720A and the second routing line 720B to connect the first set of capacitors 706A and the second set of capacitors 706B between the ground plane 702 and the routing lines 720. The one end (e.g., terminal 722A) of the first routing line 720A is disconnected from the other end (e.g., terminal 722B) of the second routing line 720B to guarantee that the bypass capacitors behave capacitively for both the common mode and differential mode.

A circuit is achieved where the supply voltage Vdd is provided to a center tap node 713 such that Vdd is received at a center tap of the exterior inductor 716 inserted between the first and second set of bypass capacitors 706A, 706B and the center tap node 713. This circuit forms a parallel resonance with the first and second set of bypass capacitors 706A, 706B such that the resonance frequency is below the operating frequency. As a result, further inductance from the Vdd connection has negligible effects on the common mode inductance of the planar differential inductor 700A.

Figure 8A:
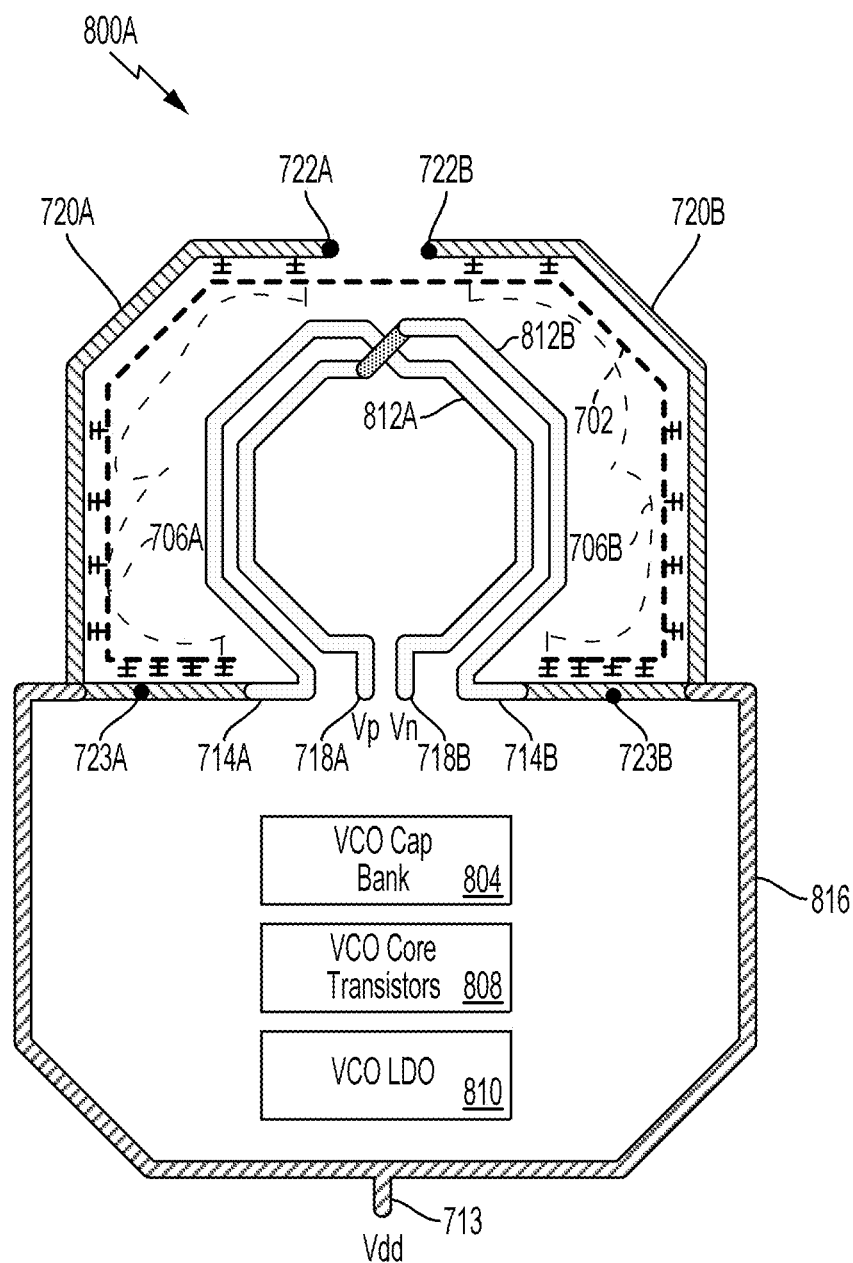
FIG. 8A illustrates another structure of a planar differential inductor with fixed differential and common mode inductance according to aspects of the present disclosure.

FIG. 8A illustrates another structure of a planar differential inductor 800A with fixed differential and common mode inductance, according to aspects of the present disclosure. For illustrative purposes, some of the labelling and numbering of the devices and features of FIG. 8A are similar to those of FIG. 7A. While the interior inductor 712 of FIG. 7A is partially enclosed by the exterior inductor 716, the interior inductor (812A and 812B) of FIG. 8A is neither partially enclosed nor fully enclosed by the exterior inductor 816. Instead, the exterior inductor 816 of FIG. 8A partially encloses one or more of a capacitor bank 804 (similar to capacitor bank 404), transistors 808 of the core of the VCO (e.g., cross coupled pair of transistors 408A and 408B) and a voltage supply 810 (e.g., a low dropout (LDO) regulator) to supply voltage to the VCO or the planar differential inductor 800A.

Figure 8B:
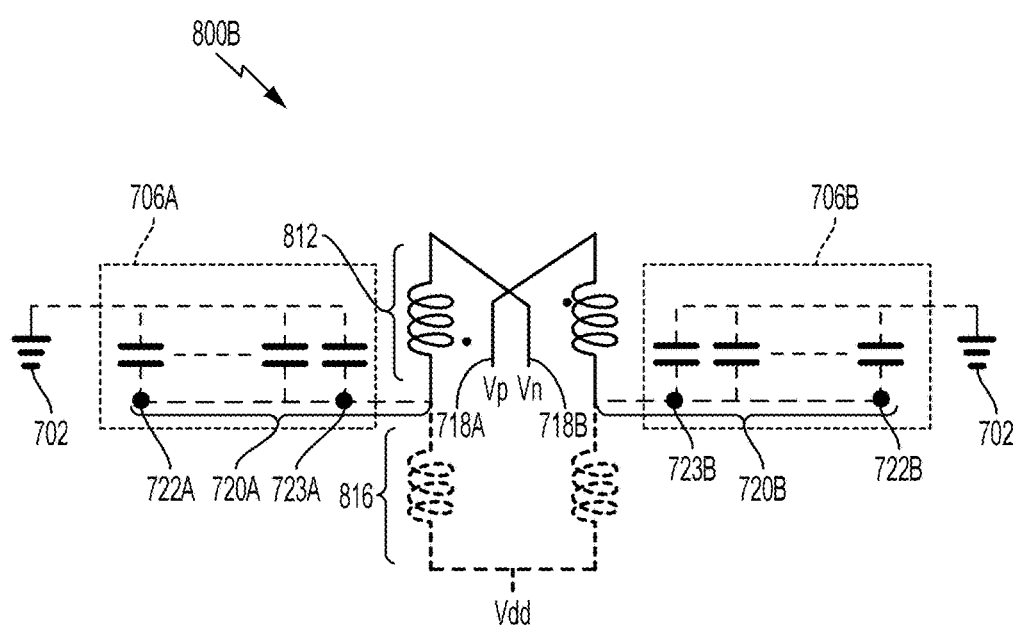
FIG. 8B illustrates an equivalent circuit of the structure of the planar differential inductor of FIG. 8A according to aspects of the present disclosure.

FIG. 8B illustrates an equivalent circuit 800B of the planar differential inductor 800A of FIG. 8A. The interior inductor 712 or 812 and the exterior inductor 716 or 816 may be arranged in multiple directions. For example, the exterior inductor 716 can be bent upwardly, as in FIG. 7A, such that the exterior inductor 716 partially encloses the interior inductor 712. Alternatively, the exterior inductor 816 can be bent downwardly, as in FIG. 8A, such that the interior inductor (812A and 812B) is neither partially enclosed nor fully enclosed by the exterior inductor 816.

Figure 9:
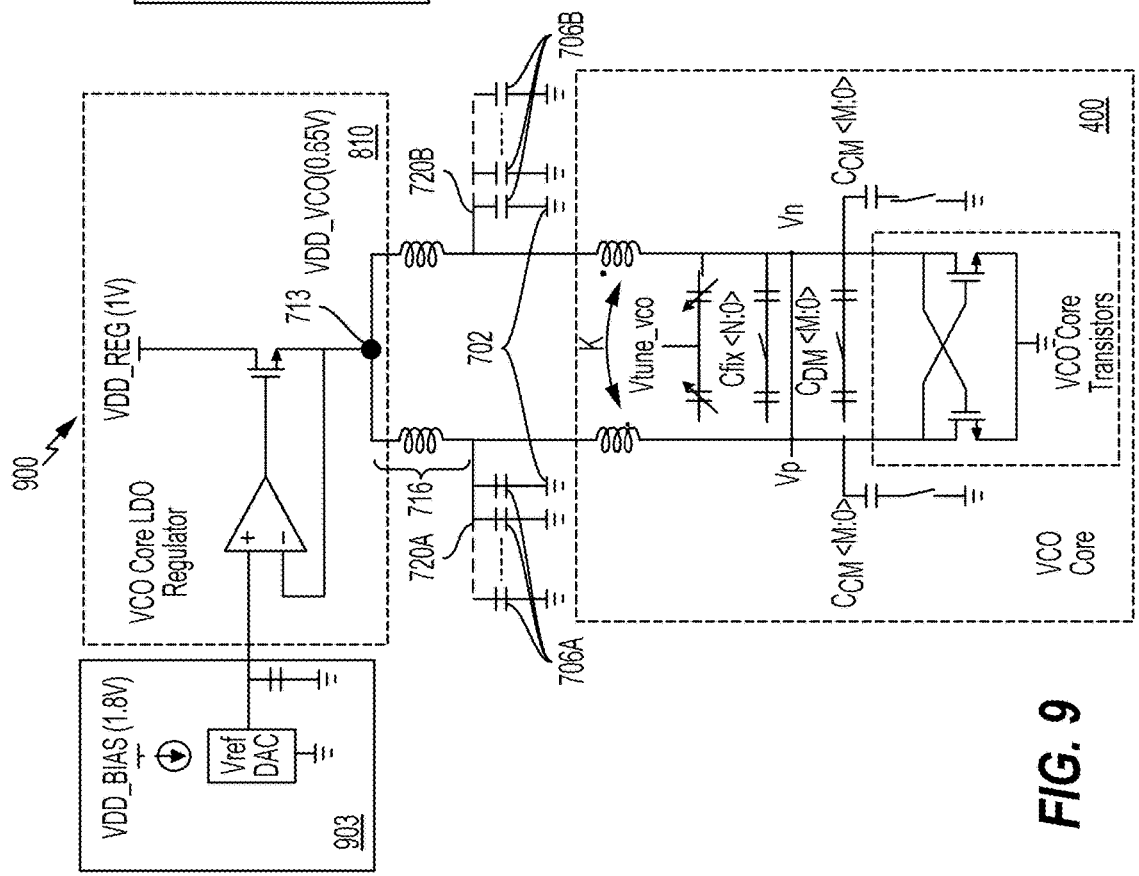
FIG. 9 illustrates an exemplary voltage controlled oscillator according to aspects of the present disclosure.

FIG. 9 illustrates an exemplary voltage controlled oscillator (VCO) 900 according to aspects of the present disclosure. For illustrative purposes, the labelling and numbering of the devices and features of FIG. 9 are similar to those of FIGS. 4, 7A, 7B, 8A, and 8B. For example, similar to FIG. 4, FIG. 9 includes a core 400 of the voltage controlled oscillator 900. However, the VCO core 400 of FIG. 9 receives the supply voltage via an exterior inductor (e.g., exterior inductor 716) and a bypass capacitor array (e.g., the first set of bypass capacitors 706A and the second set of bypass capacitors 706B), which are coupled to a ground plane (e.g., ground plane 702) and routing lines (e.g., the first routing line 720A and the second routing line 720B). A power supply source (e.g., VCO low dropout (LDO) regulator 810) provides the supply voltage Vdd to a center tap node (e.g., center tap node 713) of the exterior inductor 716. The VCO LDO regulator output voltage may be programmed by a bias circuit 903, which provides a reference voltage to the VCO LDO regulator 810.

Figure 10:
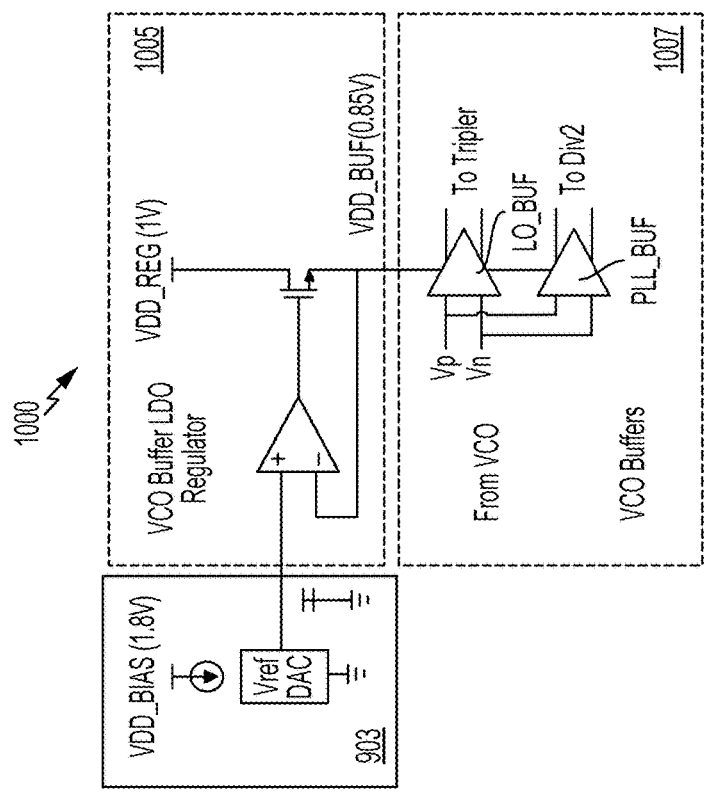
FIG. 10 illustrates an exemplary buffer circuit at an output of the voltage controlled oscillator of FIG. 9 according to aspects of the present disclosure.

FIG. 10 shows an exemplary buffer circuit 1000 at an output of the voltage controlled oscillator of FIG. 9. For illustrative purposes, the labelling and numbering of the devices and features of FIG. 10 are similar to those of FIGS. 4 and 9. The buffer circuit 1000 includes a VCO buffer LDO regulator 1005 and a VCO output buffer(s) 1007 coupled to the VCO buffer LDO regulator 1005. The VCO buffer LDO regulator 1005 provides a supply voltage VDD_BUF to the VCO output buffer(s). The VCO buffer LDO regulator 1005 may be programmed by a bias circuit (e.g., the bias circuit 903), which provides the reference voltage to the VCO buffer LDO regulator 1005. In some aspects, the VCO output buffer(s) 1007 may be powered from a same or separate voltage regulator as a VCO core. The inputs to the VCO output buffer(s) 1007 labeled "From VCO" connect to a plus and minus side of the VCO tank, labeled Vp and Vn. In one aspect of the disclosure, the VCO output buffer(s) 1007 filters and amplifies Vp and Vn from the VCO tank and provides it to devices that are supported by the VCO.

Figure 11:
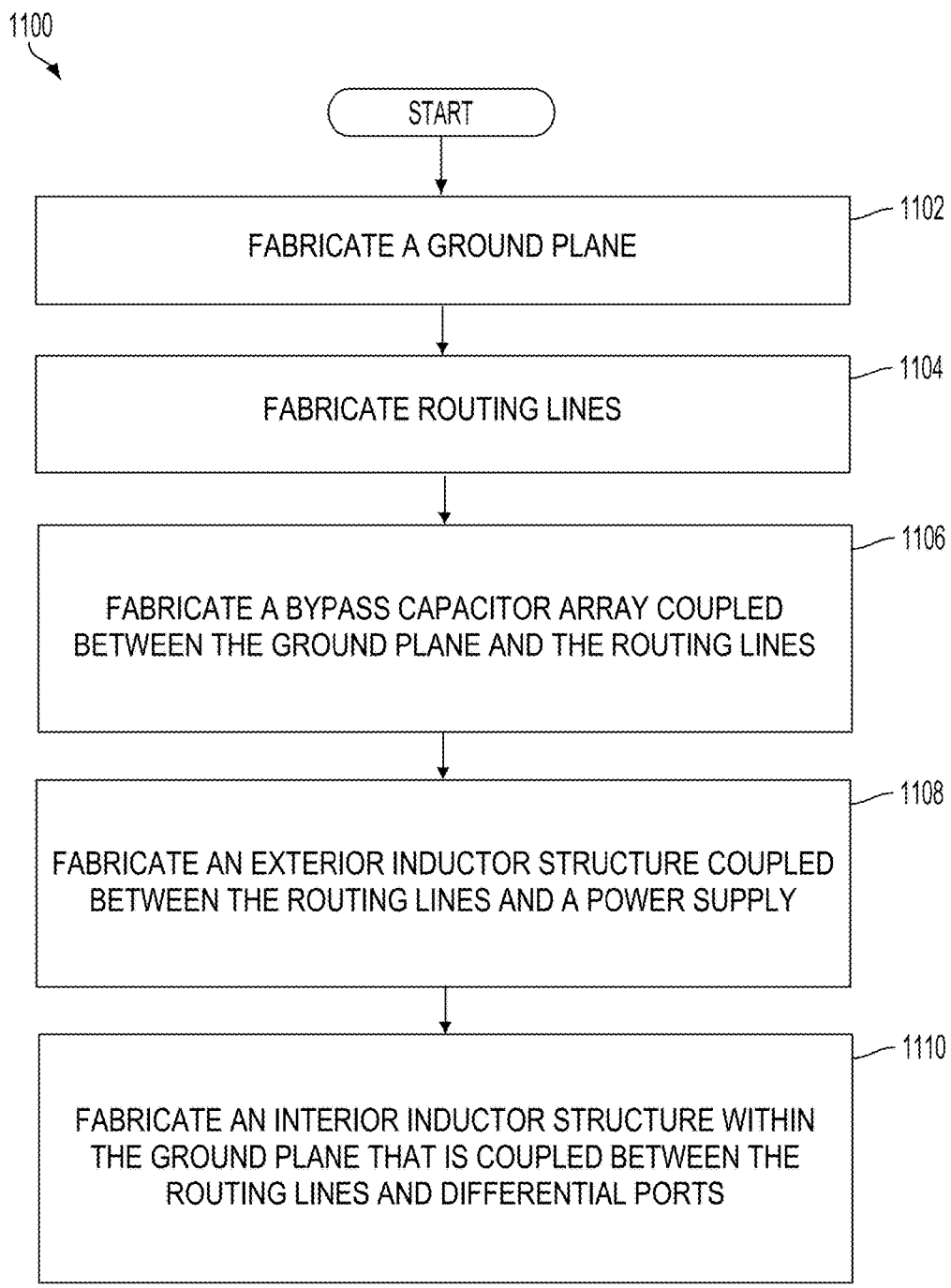
FIG. 11 is a flow diagram illustrating a method of fabricating a planar differential inductor according to aspects of the disclosure.

FIG. 11 depicts a simplified flowchart 1100 of a method of fabricating a planar differential inductor. At block 1102, a ground plane is fabricated. At block 1104, routing lines are fabricated. At block 1106, a bypass capacitor array coupled between the ground plane and the routing lines is fabricated. At block 1108, an exterior inductor structure coupled between the routing lines and a power supply is fabricated. At block 1110 an interior inductor structure within the ground plane and coupled between the routing lines and differential ports is fabricated.

It is to be noted that the sequence of the blocks of the method can occur in a different sequence than what is shown, depending on the metal stack build process. For example, the sequence of the blocks may start with block 1106, then, block 1102, then 1104 followed by the fabrication of the inductors at block 1108 and 1110. For example, the capacitors can be on metal one to metal 4 (M1 to M4), the ground plane can be in metals 5 and 6 (M5 and M6), the routing lines, most of the interior inductor and all of the exterior inductor can be in metal 7 (M7) and the overpass for the interior inductor can be in metal 8 (M8). Alternatively, the ground plane could be first, then a bypass capacitor, then routing lines, the exterior inductor and the interior inductor.

According to one aspect of the present disclosure, a planar differential inductor is described. The planer differential inductor includes first means for achieving resonance with the bypass capacitor array. The first means may, for example, be the exterior inductor 716, and/or 6. The planer differential inductor further includes second means for achieving resonance with the bypass capacitor array. The second means may, for example, be the interior inductor 712, and/or the interior inductor 812. In another aspect, the aforementioned means may be any module or any apparatus or material configured to perform the functions recited by the aforementioned means.

FIG. 12 is a block diagram showing an exemplary wireless communication system in which a configuration of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225B, and 1225C that include the disclosed planar differential inductor. It will be recognized that other devices may also include the disclosed planar differential inductor, such as the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the planar differential inductor.

Figure 13:
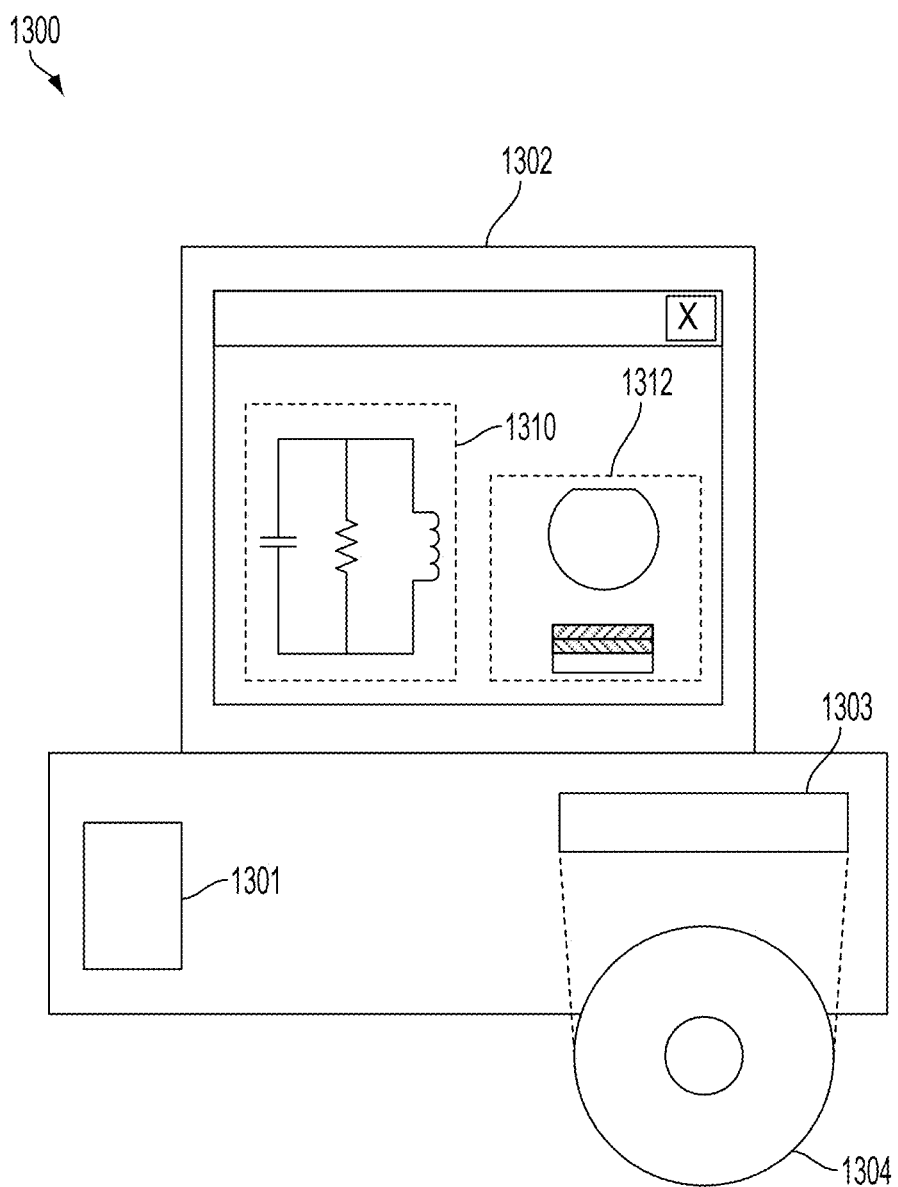
FIG. 13 is a block diagram illustrating a design workstation used for circuit, layout, and logic design of the transistor according to aspects of the present disclosure.

FIG. 13 is a block diagram illustrating a design workstation used for circuit, layout, and logic design of the planar differential inductor disclosed above. A design workstation 1300 includes a hard disk 1301 containing operating system software, support files, and design software such as Cadence or OrCAD. The design workstation 1300 also includes a display 1302 to facilitate design of a circuit 1310 or a planar differential inductor. A storage medium 1304 is provided for tangibly storing the design of the circuit 1310 or the planar differential inductor. The design of the circuit 1310 or the planar differential inductor may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the planar differential inductor by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A planar differential inductor, comprising:
a ground plane;
a plurality of routing lines;
a bypass capacitor array coupled between the ground plane and the plurality of routing lines;
an exterior inductor structure coupled between the plurality of routing lines and a power supply; and
an interior inductor located within the ground plane and coupled between the plurality of routing lines and differential ports, the plurality of routing lines at least partially surrounding the interior inductor.

2. The planar differential inductor of claim 1, in which the bypass capacitor array comprises a first bypass capacitor array coupled to a first of the plurality of routing lines, and a second bypass capacitor array coupled to a second of the plurality of routing lines.

3. The planar differential inductor of claim 2, in which at least one end of a first of the plurality of routing lines which is connected to the first bypass capacitor array is disconnected from an end of a second of the plurality routing lines connected to the second bypass capacitor array.

4. The planar differential inductor of claim 1, in which the plurality of routing lines are on a different level than the ground plane.

5. The planar differential inductor of claim 1, in which the plurality of routing lines are outside a perimeter of the ground plane.

6. The planar differential inductor of claim 1, coupled to a capacitor as part of an inductor-capacitor (LC) tank that operates as a resonator within a voltage controlled oscillator (VCO).

7. The planar differential inductor of claim 1, in which the exterior inductor structure is center-tapped and a center tap contact of the exterior inductor structure is connected to the power supply.

8. The planar differential inductor of claim 1, in which the interior inductor is partially enclosed by the exterior inductor structure.

9. The planar differential inductor of claim 1, in which a capacitor bank of a voltage controlled oscillator (VCO), a low dropout (LDO) regulator of the VCO, and/or core transistors are partially enclosed by the exterior inductor structure.

10. A method of fabricating a planar differential inductor comprising:
fabricating a ground plane;
fabricating a plurality of routing lines;
fabricating a bypass capacitor array coupled between the ground plane and the plurality of routing lines;
fabricating an exterior inductor structure coupled between the plurality of routing lines and a power supply; and
fabricating an interior inductor structure located within the ground plane and coupled between the plurality of routing lines and differential ports, the plurality of routing lines at least partially surrounding the interior inductor.

11. The method of claim 10, further comprising fabricating the plurality of routing lines on a different level than the ground plane.

12. The method of claim 10, further comprising fabricating the plurality of routing lines outside a perimeter of the ground plane.

13. The method of claim 10, further comprising fabricating the exterior inductor structure to partially enclose the interior inductor structure.

14. A planar differential inductor, comprising:
a ground plane;
a plurality of routing lines;
a bypass capacitor array coupled between the ground plane and the plurality of routing lines;
first means for achieving resonance with the bypass capacitor array, the first means coupled between the plurality of routing lines and a power supply; and
second means for achieving resonance with the bypass capacitor array, the second means located within the ground plane and coupled between the plurality of routing lines and differential ports, the plurality of routing lines at least partially surrounding the second means for achieving resonance.

15. The planar differential inductor of claim 14, in which the bypass capacitor array comprises a first bypass capacitor array coupled to a first of the plurality of routing lines, and a second bypass capacitor array coupled to a second of the plurality of routing lines.

16. The planar differential inductor of claim 15, in which at least one end of a first of the plurality of routing lines which is connected to the first bypass capacitor array is disconnected from an end of a second of the plurality of routing lines connected to the second bypass capacitor array.

17. The planar differential inductor of claim 14, in which the plurality of routing lines are on a different level than the ground plane.

18. The planar differential inductor of claim 14, in which the plurality of routing lines are outside a perimeter of the ground plane.

19. The planar differential inductor of claim 14, coupled to a capacitor as part of an inductor-capacitor (LC) tank that operates as a resonator within a voltage controlled oscillator (VCO).

20. The planar differential inductor of claim 14, in which the second means is partially enclosed by the first means.

* * * * *